United States Patent [19]

Schaffer et al.

[11] 4,042,867
[45] Aug. 16, 1977

[54] REMOTE SELECTOR FOR FLIGHT INSTRUMENTS

[75] Inventors: Richard Earl Schaffer, Scottsdale; Paul Allen Rauschelbach, Phoenix, both of Ariz.

[73] Assignee: Sperry Rand Corporation, New York, N.Y.

[21] Appl. No.: 591,559

[22] Filed: June 30, 1975

[51] Int. Cl.² .................................................. G05B 11/01
[52] U.S. Cl. ................................. 318/580; 318/585; 318/591; 318/446; 318/490
[58] Field of Search ............... 318/580, 585, 586, 591, 318/140, 446, 490

[56] References Cited
U.S. PATENT DOCUMENTS

| 2,406,856 | 9/1946 | Satterlee | 318/490 X |
| 3,688,175 | 8/1972 | Rauschelbach | 318/580 |

Primary Examiner—B. Dobeck
Attorney, Agent, or Firm—Howard P. Terry

[57] ABSTRACT

Apparatus for remotely adjusting reference indicia of display instruments such as flight instruments wherein a knob affixed to the shaft of a d.c. generator, remotely disposed from the flight instrument produces a d.c. signal, the magnitude and polarity of which are dependent on the speed and direction, respectively, of rotation of the knob. The d.c. signal is coupled to a d.c. motor mechanically connected to said flight instrument reference indicia and adjusts the same accordingly. The apparatus further includes circuitry, electrically connected between the d.c. generator and the d.c. motor for producing compensating voltages equal to the start-up voltages of the d.c. motor, which when added to the d.c. signal insure a continuous response by the d.c. motor to the d.c. signal, and also for isolating the output impedance of the d.c. generator from the d.c. motor.

11 Claims, 4 Drawing Figures

REMOTE SELECTOR FOR FLIGHT INSTRUMENTS

BACKGROUND OF THE INVENTION

1. Field of the Invention

The invention relates to remotely adjustable instrumentation, such as aircraft flight instruments and more particularly to apparatus for remotely adjusting positionable reference indicia of such flight instruments.

2. Description of the Prior Art

The positioning of reference cursors, pointers, etc. of many types of flight instruments from a remote location is a desirable feature in modern day aircraft. Pilot workload is reduced or made more convenient by permitting him to initiate control and adjustments of the various indicia from a central control location within an easy reach. Typical of the flight instruments in which remote adjustment is desirable is a horizontal situation indicator (HSI), which integrates many display parameters associated with the lateral plane of flight and normally includes manually settable reference indicia or cursors such as a heading select cursor and a course select cursor, which may have to be adjusted many times during a typical flight.

In the prior art, the heading select cursor and the course select pointer have been adjusted remotely by a conventional servometer controlled by a back-to-back knob/synchro, servo synchro arrangement. More particularly, a rotatable knob is mechanically coupled, by means of a fixed gear ratio, to the rotor of a remote transmitter synchro. The stator of the synchro transmits rotor positional data to the stator winding of a receiving synchro disposed at the flight instrument whereupon the appropriate voltage is induced in the rotor winding thereof. The rotor output is applied to a servomoter which adjusts the heading cursor or select pointer accordingly and repositions the receiver rotor until its signal goes to zero.

Utilizing such servo systems to remotely adjusting flight instruments, has several disadvantages. Firstly, a servo mechanism is costly with its gearing, motor, amplifier and synchro along with the remote controller synchro and gearing. Secondly, the heading knobs on the indicator itself are rendered useless since the servo will act to return heading cursor to the former position as dictated by the remote knob unless complex mechanical differential clutch means are incorporated further increasing the over-all instrument cost. Thirdly, the alignment and calibration of a servo system must be performed periodically due to wear on the gears, etc. thereby increasing maintenance costs and total cost of ownership.

SUMMARY OF THE INVENTION

The present invention eliminates the aforementioned difficulties by incorporating a remote knob/tachometer positioning system in conjunction with a d.c. cursor positioning motor disposed in the flight instrument. More particularly, the remote assembly is comprised of a knob affixed to a shaft extending from a d.c. generator (tachometer); rotation of which results in the generation of a d.c. signal, dependent in amplitude and polarity on the speed and direction of the rotation of the knob. The d.c. signal is coupled through a compensating circuit to the d.c. motor, which mechanically positions the cursor accordingly.

A coupling circuit isolates the d.c. generator from the d.c. motor thereby permitting the cursor to be set by the instrument knob when desired, without the increased drag imposed thereon by the motor. The coupling circuit also generates compensating or break-away voltages to be added to the d.c. signal from the d.c. generator to overcome the start-up voltages typically required by d.c. motors and thereby eliminate any discontinuities in the response of the d.c. motor to the d.c. generator signal. This insures the accuracy of the control of the system and its ease of manual operation.

Additionally, the control gain of the system is simply determined by resistors in the coupling circuit. This permits the control gain to be changed expeditiously be merely changing the resistance values.

DESCRIPTION OF THE PREFERRED EMBODIMENT

Figure 1:
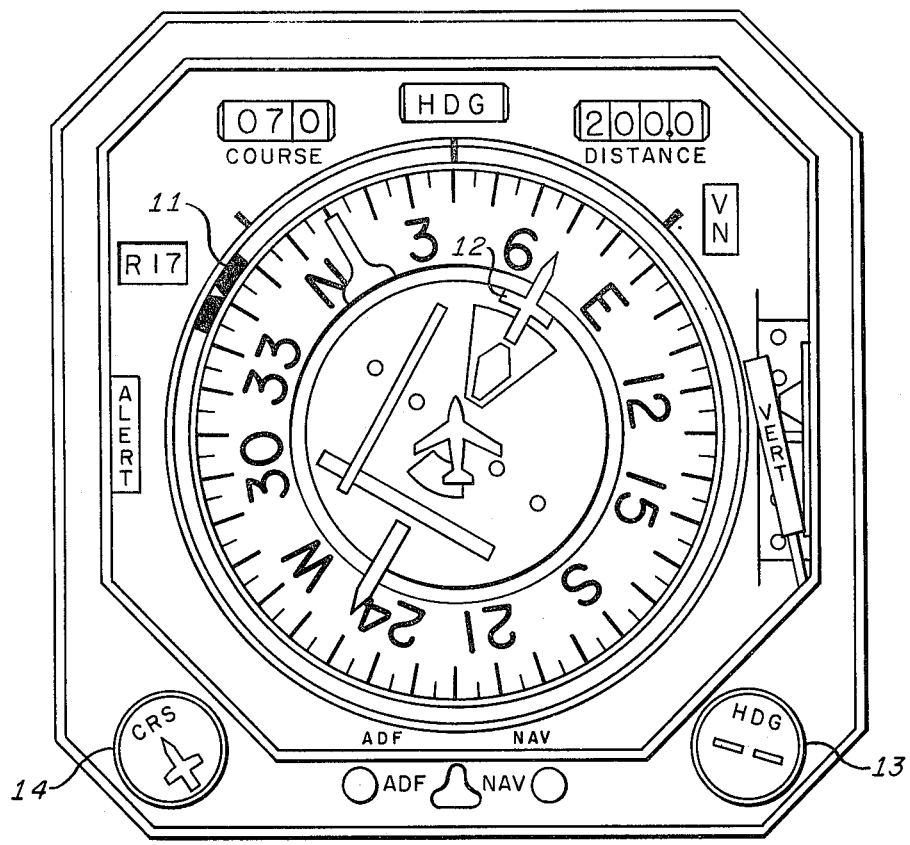
FIG. 1 is an illustration of a typical aircraft navigation instrument, i.e., an HSI particularly depicting the normal heading cursor and the course select pointer and associated selector knobs.

FIG. 1 illustrates a typical horizontal situation indicator (HSI) 10 utilized in airborne craft. In particular, FIG. 1 illustrates the heading cursor 11, the course select pointer 12, the heading and course knobs 13 and 14 utilized to adjust the heading cursor 11 and the course select pointer 12, respectively, at the instrument itself.

Figure 2:
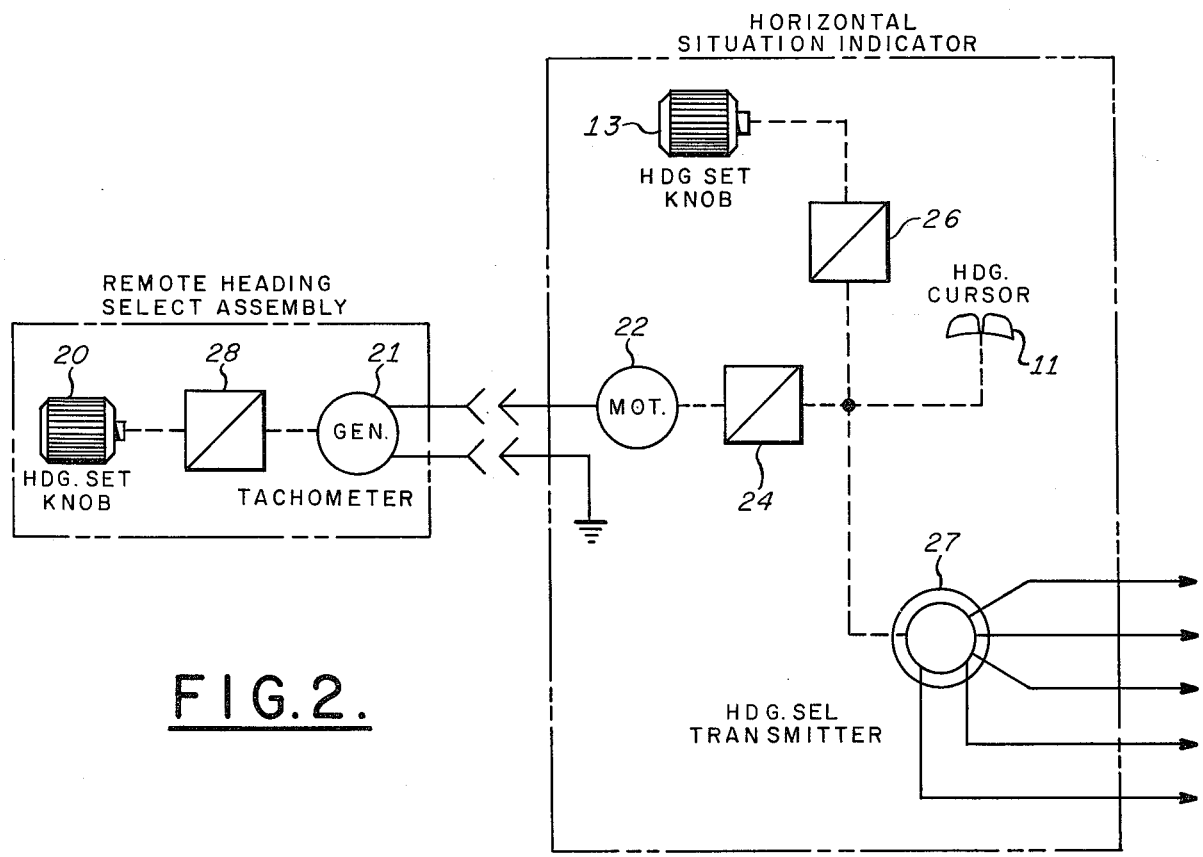
FIG. 2 is a schematic block diagram illustrating a simplified version of the present invention.

FIG. 2 illustrates a simplified form of the present invention. A knob 20 is attached to a shaft extending from a d.c. generator or tachometer 21, or if desired or required, through suitable gearing 28. The d.c. generator 21 produces a d.c. signal in response to the rotation of the knob 20. Furthermore, the magnitude and polarity of this d.c. signal is dependent on the velocity and direction, respectively, of rotation of the knob 20. The d.c. signal is applied to a d.c. motor 22 which rotates in response thereto and drives the heading cursor 11 accordingly through a fixed gear ratio 24.

FIG. 1 depicts also the heading set knob 13 disposed on the flight instrument, which may be used to directly adjust the heading cursor 11 through an appropriate gear ratio 26. The adjustments to the heading cursor may be applied directly to a heading select transmitter synchro 27 which transmits the heading select information to the appropriate utilization apparatus of the aircraft, such as an automatic pilot or flight director system.

In the prior art closed loop synchro/servo system, without mechanical differential isolator, the receiving synchro would detect any variation in the position of the heading cursor from the position of the remote knob. Therefore, any adjustment of the heading cursor through the heading select knob on the HSI would be immediately cancelled by the servo system. This cannot occur with the system of the present invention since the remote selector is simply a d.c. generator which provides only a positioning signal and not a position signal.

Therefore, there is no nulling effect in the present invention after the heading cursor has been adjusted thereby permitting the heading set knob on the HSI to be effectively utilized at any time desired.

While the simplified version of the present invention depicted in FIG. 1 may be suitable in some applications, it may not be suitable in others. For example, a d.c. motor usually has a starting or break-away voltage, in both directions, below which it will not respond. This characteristic is typically referred to as the "dead zone" wherein the heading cursor, will not respond to small d.c. generator outputs. This causes an undesirable discontinuity or non-linearity in the response of the d.c. motor 22 to the d.c. generator 21. Each time the remote knob 20 is rotated, the d.c. signal must reach the level of the start-up voltage before any d.c. motor, or heading cursor response, is forthcoming. This will obviously affect the ability of a pilot to set the display since small movement of the knob to make fine adjustments will cause no motion in the cursor.

Secondly, the low impedance of the d.c. generator or tachometer imposes a short circuit on the d.c. motor 22. This electrical load produces a mechanical load on instrument knob 25 due to the shorting of the back EMF of the d.c. motor through the generator. This mechanical load on the knob 25 may be objectionable to the pilot or become so high as to prevent rotation of the knob.

Figure 3:
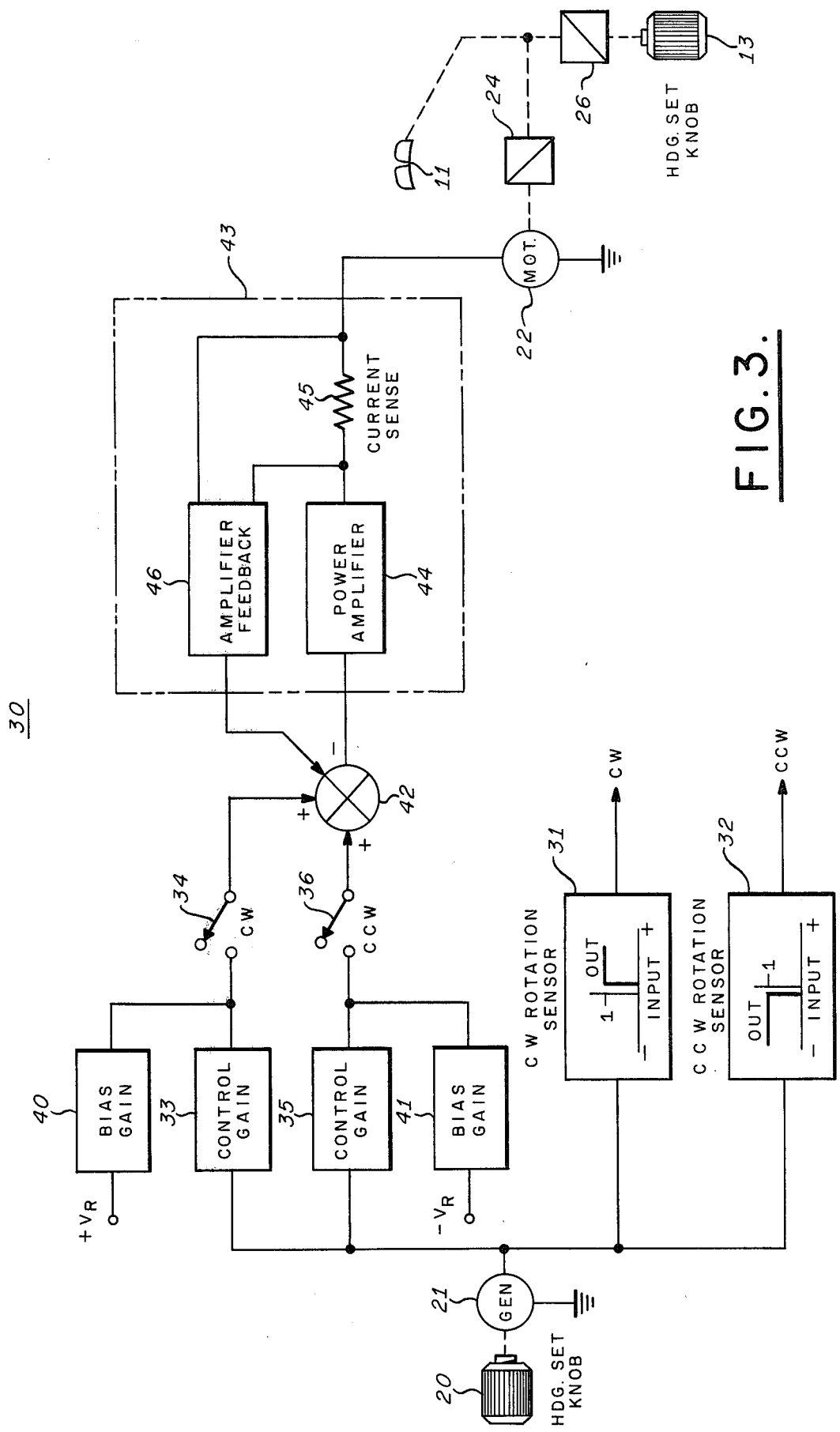
FIG. 3 is a schematic block diagram illustrating the present invention with the coupling circuit incorporated therein.

To eliminate these aforementioned problems, a coupling circuit 30 is electrically coupled between the d.c. generator 21 and the d.c. motor 22 and serves as a means for linearizing the response of the motor 22 to the generator 21 and for isolating the motor 22 from the generator 21 when instrument knob 22 is used. FIG. 3 illustrates a preferred embodiment of the coupling circuit 30 in block diagram form. As shown therein, the coupling circuit 30 comprises a clockwise rotation sensor 31 and a couterclockwise rotation sensor 32, both of which are coupled to the d.c. generator 21. A clockwise control gain circuit 33 is coupled between the d.c. generator 21 and a clockwise electronic switch 34. A counterclockwise control gain circuit 35 is similarly coupled between the d.c. generator 21 and a counterclockwise electronic switch 36. Clockwise bias circuit 40 and counterclockwise bias circuit 41 are coupled to the clockwise control gain circuit 33 and a counterclockwise control gain circuit 35, respectively. Both electronic switches are coupled to a summing junction 42. The output of the summing junction is connected to a buffer or isolation amplifier circuit 43 comprising a power amplifier 44, a current sensing element such as resistor 45 and a differential amplifier 46 connected in feedback around amplifier 44. The output from the amplifier circuit 43 is coupled to the d.c. motor 22. The gain of the buffer amplifier 43 which is preferably adjustable, may be employed to determine the ratio of knob 21 movement to the movement of the display cursor 11.

The output of the d.c. generator 21 is coupled to both control gain circuits 33 and 35, each of which preferably includes an adjustable resistor which serves as a means for adjusting the sensitivity or "gear ratio" between the remote set knob 20 and cursor 11. The output from the control gain circuits 33 and 35 are summed with the clockwise and counterclockwise voltage bias voltages respectively. The clockwise bias circuit 40 is connected to a source of positive reference voltage and its output is adjusted to a value equal to the start-up voltage after amplification by the amplifier circuit 43, of the d.c. motor 22 in the clockwise direction. Similarly, the counterclockwise bias circuit 41 is connected to a source of negative reference voltage and its output is adjusted to a value equal to the start-up voltage, before amplification, of the d.c. motor 22, in the counterclockwise direction. Typically, each of the bias circuits 40 and 41 may be comprised of a variable resistor element which attenuates the positive and negative reference voltages, respectively, to the break-away voltage levels of the motor 22 and provides a means of readily matching the coupling circuit 30 to the particular characteristics of the motor 22.

In the absence of any rotaion of the heading set knob, the electronic switches 34 and 36 will remain in the non-conductive state, thereby isolating any d.c. signals at the output of the control gain circuits 33 and 35 from amplifier 43 and the d.c. motor 22. When the heading set knob 20 is rotated in a clockwise direction, a positive d.c. signal is generated from d.c. generator 21 proportional in magnitude to the speed with which the knob is rotated. The positive polarity of this signal will be detected by the clockwise rotation sensor 31 which produces an output in response thereto for switching electronic switch 34 to its conductive state. Similarly, the negative signal produced by a counterclockwise rotation of the heading set knob 20 will be detected by the counterclockwise rotation sensor 32 which in turn will switch electronic switch 36 to the conductive state.

Thus, upon rotation of the remote knob 20, a signal is produced by generator 21 proportional in amplitude and polarity to the speed and direction of knob rotation. This signal trips the appropriate rotation sensors 31 or 32 which in turn closes the corresponding switches 34 or 36. The threshold of sensors 31 and 32 is normally set quite low so that only slight movement of the knob will trip the switches 34 and 36. Upon closure of either of the switches, the break-away bias voltage from 40 or 41 is applied to amplifier 43 and motor 22 thereby conditioning the motor 22 to immediately respond to the knob generator signal. This arrangement thus provides a means for linearizing the response of the cursor 11 movement to the remote selector knob movement.

If the heading set knob 25 disposed on the HSI is utilized to adjust the heading cursor 23, a voltage is developed across the d.c. motor 22 due to the mechanical connections 24 and 26. In response to this voltage, the differential amplifier feedback circuit 46 will drive power amplifier 44 to a point where effectively zero d.c. current flows through the current sense device 45. Therefore, the impedance of the amplifier circuit 43 approaches infinity, thereby effectively eliminating any back EMF drag which would otherwise be produced by the d.c. motor 22. This permits the use of a much smaller gearing ratio 26 between the instrument heading set knob 25 and a heading cursor 11.

Figure 4:
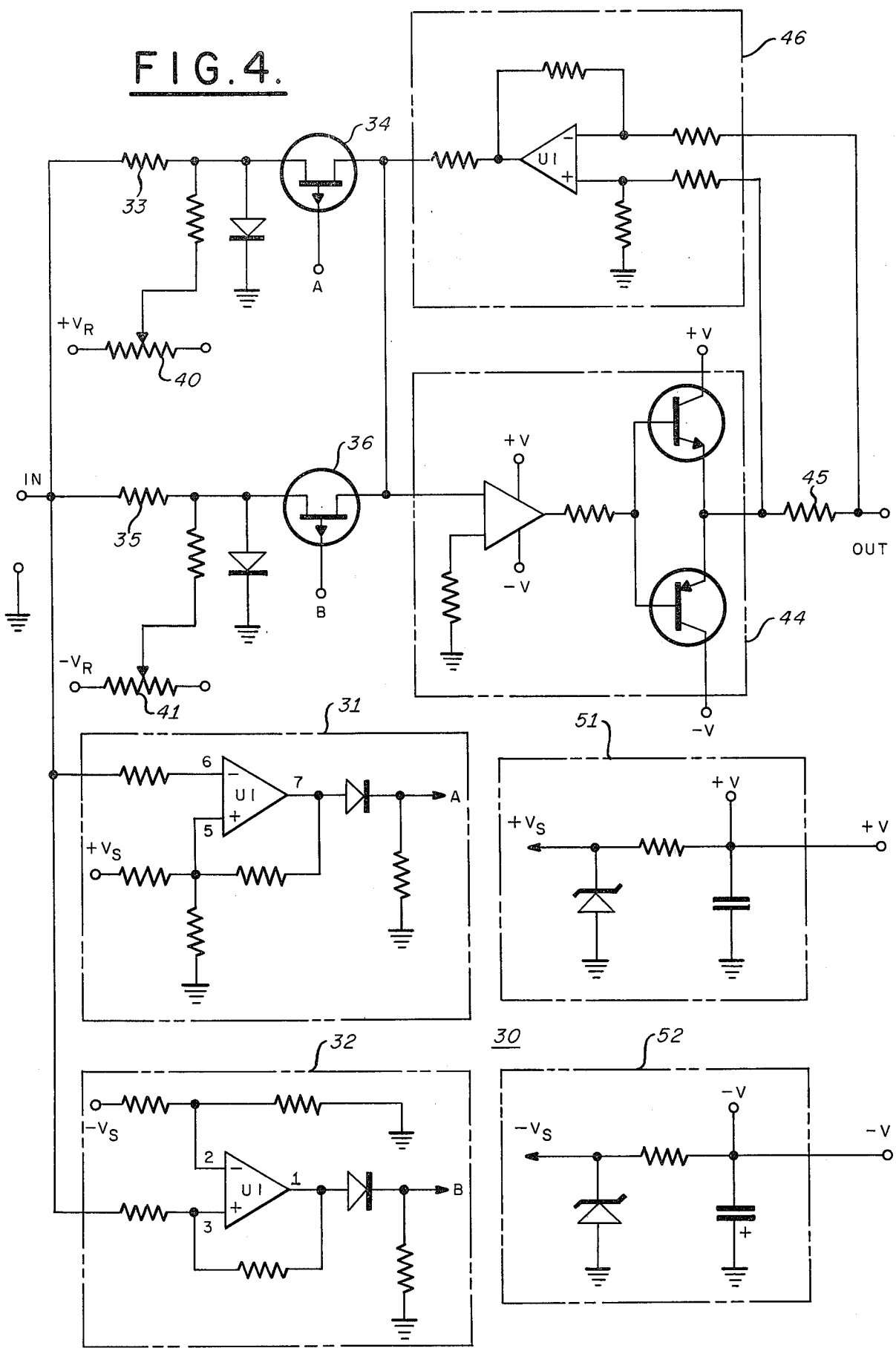
FIG. 4 is a schematic diagram depicting a preferred embodiment of the coupling circuitry.

FIG. 4 illustrates a schematic circuit diagram of a preferred circuit comprising the compensation circuit 30 of FIG. 3. In particular, the circuit elements comprising the various circuits of FIG. 3 are delineated including the clockwise and counterclockwise sensors 31 and 32, the clockwise and counterclockwise control gain circuits 33 and 35, the clockwise and counterclockwise electronic switches 34 and 36, the clockwise and counterclockwise bias circuits 40 and 41, the power amplifier 44, the current sensing element 45 and the differential amplifier feedback circuit 46. Additionally, the circuitry 51 and 52 for generating the clockwise and counterclockwise reference voltages $+V_R$ and $-V_R$, respectively, from which the clockwise and counterclockwise start-up voltages are generated, is illustrated.

It can be appreciated from FIG. 4, that the control gain circuits 33 and 35 each comprise a resistor. Accordingly, to effect a change in the control gain, i.e., sensitivity between the remote heading knob 20 and the heading cursor 11, one need only change the resistance of resistors 33 and 35 or, alternatively, variable resistors may be employed for this purpose.

The arrangement of FIGS. 3 and 4 eliminates the need for gearing in the remote mechanism to achieve a specific ratio between the remote knob movement and the display element movement. The ratio may be fixed by the control gain in the amplifier circuits which may be as simple as a single resistor. In addition to the cost saving of this technique, the sensitivity between the remote knob and the display elements in the flight instrument is considerably easier to re-establish in the field. Addtionally, the set knobs on the light instrument itself may be effectively utilized without interference from the remote setting apparatus, whereas the set knobs on the flight instrument itself are inoperable in some prior art remote setting arrangements.

It will now be appreciated that the remote cursor positioning arrangement described hereinabove provides a significant improvement over the conventional synchro data, closed loop servomechanism of prior art remote selectors in terms of electrical and mechanical complexity and hence in terms of cost of manufacture, installation, repair and maintenance. The improved system requires at the remote location only a simple, inexpensive d.c. generator, at the instrument, only a correspondingly simple d.c. motor and associated simple mechanical gearing and a simple coupling circuit. The circuit may be mounted on a small printed circuit board and located at the remote cockpit station or alternatively, it may be incorporated with the electronics within the panel mounted indicator instrument. In some applications, the simple direct generator to motor arrangement of FIG. 2 may be sufficient, while the more sophisticated arrangement of FIGS. 3 and 4 may be employed in applications requiring more precision and ease of operation.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. Apparatus for remotely adjusting display indicia of an instrument display comprising:
   manually operable rotatable means disposed remotely from said instrument,
   d.c. generator means coupled to said rotatable means for producing a d.c. generator signal dependent upon the speed and direction of rotation of said rotatable means,
   d.c. motor means coupled to said display indicia and responsive to said d.c. generator signal for adjusting said display indicia in accordance with the rotation of said rotatable means, and
   means responsive to a predetermined low value of said generator signal for providing a substantially larger signal to said d.c. motor means for overcoming the inherent break-away voltage characteristic of said d.c. motor means.

2. The apparatus as set forth in claim 1 wherein said responsive means further includes amplifier means connected to energize said d.c. motor means, said amplifier means having a gain which provides a predetermined response of said display indicia to said d.c. generator signal.

3. The apparatus as set forth in claim 1 wherein said rotatable means comprises a knob suitable for manual operation.

4. The apparatus as set forth in claim 1 wherein said instrument display includes a local manual direct indicia adjusting means coupled to said indicia and said d.c. motor means, said apparatus further including circuit means coupling said d.c. generator means to said d.c. motor means, said circuit means including means for isolating any low impedance of said d.c. generator means from said d.c. motor means, whereby said d.c. motor means does not oppose movement of said local indicia adjusting means.

5. The apparatus as set forth in claim 4 wherein said circuit means includes a differential feedback amplifier for amplifying said d.c. generator signal and for providing a high impedance load to isolate said d.c. generator means from any voltage produced by said d.c. motor means due to operation of said local manual adjustment means.

6. The apparatus as set forth in claim 1 wherein said responsive means further includes sensor means responsive to said predetermined low value of said generator signal, switching means controlled by said sensor means, and bias voltage generating means for generating a bias voltage substantially equal to said break-away voltage whereby said bias voltage is coupled to said d.c. motor means for values of said d.c. generator signal above said predetermined low value.

7. The apparatus as set forth in claim 6 wherein said d.c. generator means is characterized by finite break-away voltages for both clockwise and counterclockwise rotation, and wherein said means for generating bias voltage includes means for generating first and second bias voltages respectively proportional to said clockwise and counterclockwise break-away voltages and threshold means responsive to the polarity of said d.c. generator signal for supplying the corresponding bias voltage to said d.c. motor means wherein the polarity of said d.c. generator signal is dependent on the direction of rotation of said rotatable means.

8. The apparatus as set forth in claim 7 wherein said means for generating bias voltage includes means for summing said first bias voltage with said d.c. generator signal and for summing said second bias voltage with said d.c. generator signal and wherein said threshold means includes clockwise and counterclockwise sensitve switch means responsive to said d.c. generator signal for supplying the corresponding summed voltages to said d.c. motor means.

9. The apparatus as set forth in claim 1 further including coupling means for coupling said d.c. generator signal to said d.c. motor means, said motor means having finite break-away voltage characteristics comprising:
   first and second threshold means responsive to said d.c. generator signal for detecting the positive and negative polarities thereof respectively, wherein the polarity of said d.c. generator is dependent upon the direction of rotation of said rotatable means,
   first gain control means for establishing the gain of a positive polarity d.c. generator signal, second gain control means for establishing the gain of a negative polarity d.c. generator signal, means for supplying a first bias voltage corresponding to the positive break-away voltage characteristic of said d.c. motor, means for supplying a second bias voltage corresponding to the negative break-away voltage characteristic of said d.c. motor, first summing means for summing the output of said first gain control means with said first bias voltage, second summing means for summing the output of said second gain control means with said second bias voltage, and first and second switching means responsive respectively to said first and second threshold means for connecting the respective outputs of said first and second summing means to said d.c. motor means.

10. The apparatus as set forth in claim 9 wherein said instrument display includes a local manual direct indicia adjusting means coupled to said display indicia and d.c. motor means, and wherein said coupling means further includes a differential feedback amplifier for amplifying the signal from said switching means and for providing a high impedance load for any voltage produced by said d.c. motor due to operation of said local manual adjusting means.

11. The apparatus as set forth in claim 9 wherein said first and second gain control means are comprised of resistors, thereby permitting the response of said d.c. motor means to said rotatable means to be varied by changing the resistance values thereof.

* * * * *